United States Patent
Li et al.

(10) Patent No.: US 9,613,694 B1
(45) Date of Patent: Apr. 4, 2017

(54) ENHANCED PROGRAMMING OF TWO-TERMINAL MEMORY

(71) Applicant: Crossbar, Inc., Santa Clara, CA (US)

(72) Inventors: Zhi Li, Santa Clara, CA (US); Tanmay Kumar, Pleasanton, CA (US); Sung Hyun Jo, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/821,989

(22) Filed: Aug. 10, 2015

(51) Int. Cl.
*G11C 11/00* (2006.01)
*G11C 13/00* (2006.01)

(52) U.S. Cl.
CPC ...... *G11C 13/0069* (2013.01); *G11C 13/0011* (2013.01)

(58) Field of Classification Search
CPC .................. G11C 13/0069; G11C 13/0011
USPC ........................................................ 365/148
See application file for complete search history.

(56) References Cited

U.S. PATENT DOCUMENTS

| | | | |
|---|---|---|---|
| 2013/0207065 A1* | 8/2013 | Chiang | H01L 45/1253 257/2 |
| 2014/0192585 A1* | 7/2014 | Hashim | H01L 45/08 365/148 |
| 2014/0268998 A1* | 9/2014 | Jo | H01L 45/1253 365/148 |

* cited by examiner

*Primary Examiner* — Anthan Tran
(74) *Attorney, Agent, or Firm* — Amin, Turocy & Watson, LLP

(57) ABSTRACT

Two-terminal memory can be set to a first state (e.g., conductive state) in response to a program pulse, or set a second state (e.g., resistive state) in response to an erase pulse. These pulses generally produce a voltage difference between the two terminals of the memory cell. Certain electrical characteristics associated with the pulses can be manipulated in order to enhance the efficacy of the pulse. For example, the pulse can be enhanced or improved to reduce power-consumption associated with the pulse, reduce a number of pulses used to successfully set the state of the memory cell, or to improve Ion distribution associated with active metal particles included in the memory cell.

31 Claims, 14 Drawing Sheets

`US 9,613,694 B1`

ENHANCED PROGRAMMING OF TWO-TERMINAL MEMORY

TECHNICAL FIELD

This disclosure generally relates to enhanced techniques for changing the state of a two-terminal memory cell, and more specifically to state-changes associated with programming the memory cell and/or setting the cell to an on-state.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventor(s) believe that arrays of many such memory cells, can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventor(s) desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for optimizing or enhancing a program pulse that sets a two-terminal memory cell to a conductive state (e.g., an on-state). A memory device can include an array of memory, a controller device, and an optimization component. The array of memory can comprise a two-terminal memory cell that includes an interface layer situated between a top electrode and a bottom electrode. The controller device can program the two-terminal memory cell, which can be characterized by application of a program pulse that sets the two-terminal memory cell to a conductive state. The optimization component can optimize the program pulse based on one or more algorithms.

For example, in some embodiments, optimization of the program pulse can relate to asserting a higher magnitude voltage during a first period of the program pulse and a lower magnitude voltage during a second period of the program pulse. In some embodiments, optimization of the program pulse can relate to asserting a first voltage of a first polarity during a first period of the program pulse and a second voltage of a second polarity opposite the first polarity during a second period of the program pulse. In some embodiments, optimization of the program pulse can relate to asserting a higher magnitude voltage during a first period of the program pulse and a set of lower magnitude voltage steps during a second period of the program pulse.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
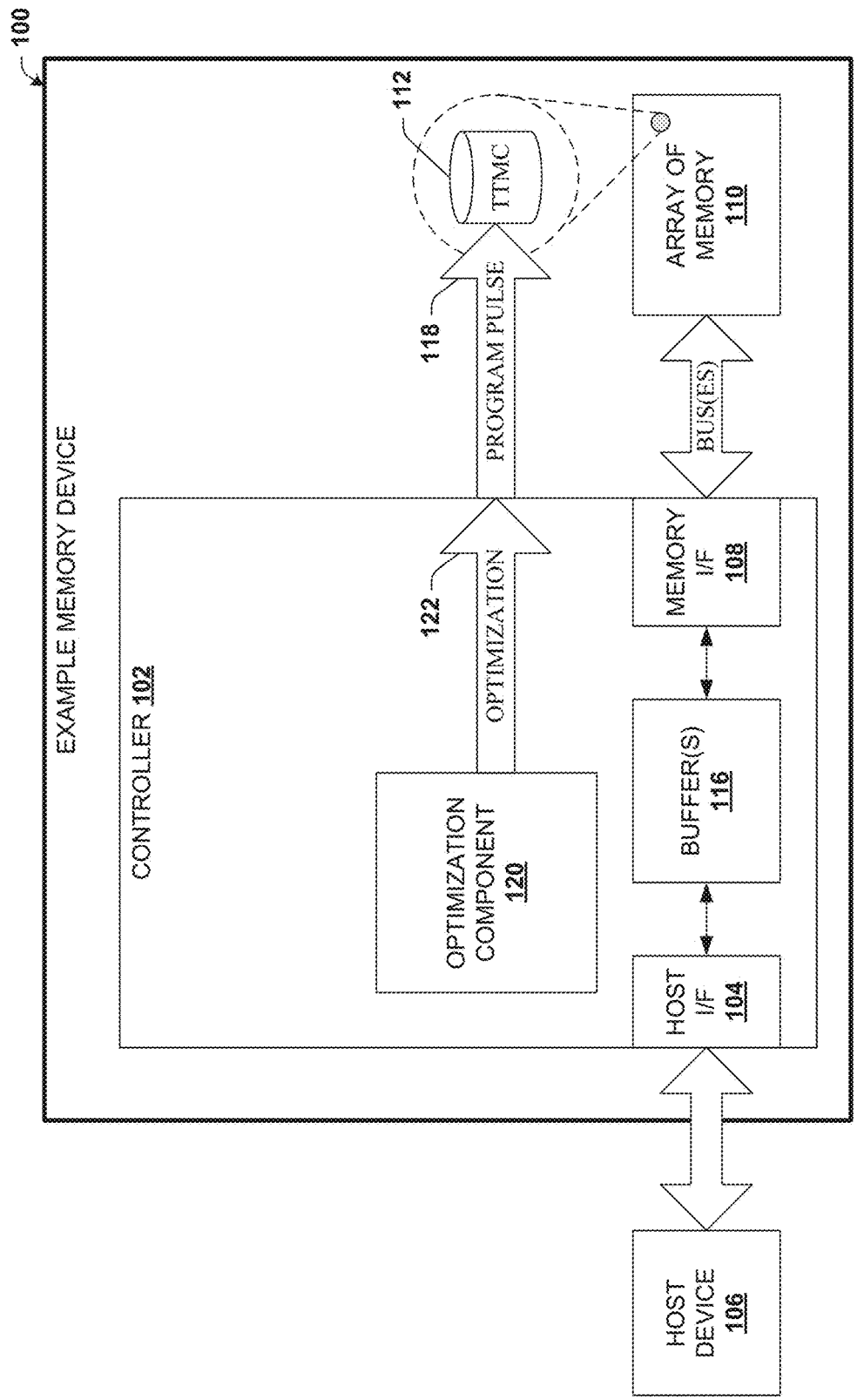
FIG. 1 illustrates a block diagram of an example memory device that can provide for optimizing electrical characteristics of a program pulse that sets a memory cell to a conductive state in accordance with certain embodiments of this disclosure.

As the name implies, two-terminal memory has two terminals or electrodes. Herein, the terms "electrode" and "terminal" are used interchangeable. Generally, a first electrode of two-terminal memory is referred to as a "top electrode" (TE) and a second electrode of the two-terminal memory is referred to as a "bottom electrode" (BE), although it is understood that electrodes of two-terminal memory can be according to any suitable arrangement, including a sideways memory cell. Situated between the TE and BE of a two-terminal memory cell is typically an interface layer sometimes referred to as a switching layer or a resistive switching layer (RSL).

Applying a program voltage (referred to herein as a "program pulse") to one of the electrodes of the two-terminal memory can cause a conductive filament to form in the interface layer. The conductive filament can be composed of metal particles of a suitable active metal that is typically included in or coupled to the electrode receiving the program pulse. By convention and as generally described herein, the TE receives the program pulse and the BE is grounded, but such is not intended to be limiting for all embodiments. Conversely, applying an "erase pulse" to one of the electrodes (generally a pulse of opposite polarity as the program pulse or to the opposite electrode as the program pulse) can remove the filament, e.g., by driving the metal ions or other material that forms the filament back toward the active metal source. Properties of this conductive filament as well as its presence or absence affect the electrical characteristics of the two-terminal memory cell such as, for example, lowering the resistance and/or increasing conductance across the two terminals when the conductive filament is present as opposed to when not present.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (Ion) can be indicative of the conductive state of the two-terminal memory cell. For example, when the conductive filament has been formed (e.g., in response to application of a program pulse), the conductance of the cell is greater than otherwise and the measured current (Ion) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (Ion) reading in response to the read pulse will be lower. By convention, when the conductive filament is formed, the memory cell is said to be in the "on-state" with a high conductance. When the conductive filament is not extant, the memory cell is said to be in the "off-state". A memory cell being in the on-state or the off-state can be logically mapped to binary values such as, e.g., "1" and "0". It is understood that conventions used herein associated with the state of the cell or the associated logical binary mapping is not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can represent multiple bits of information.

In operation, there are numerous difficulties associated with programming a memory cell. For example, it is possible that a program pulse or an erase pulse fails to change the state of the cell in the intended manner. For SLC two-terminal memory, such can mean that the program pulse failed to form the conductive filament in the interface layer; or that the erase pulse failed to remove the conductive filament in the interface layer. Either of these two events can be detected based on a subsequent read pulse that follows the program or erase pulse. If a read pulse issued after a program pulse detects that the cell is not in the on-state (e.g., what is expected after a program operation), then the program pulse is said to have failed to program the cell. Likewise, if a read pulse issued after an erase pulse detects that the cell is not in the off-state (e.g., what is expected after an erase operation), then the erase pulse is said to have failed to erase the cell.

In order to mitigate this issue, memory device logic typically operates according to an algorithm or procedure known as incremental step pulse programming (ISPP). In accordance with ISPP, if the subsequent read operation indicates that the previous program or erase operation failed to set the cell to the intended state, then the program/erase pulse is repeated, albeit generally at a higher pulse or voltage magnitude. In other words, if a program pulse with a voltage magnitude, v, fails to set the memory cell to the on-state, then another program pulse with a voltage magnitude, v+x, is asserted. In some cases, many pulses are needed before the cell is updated to the desired state. According to some ISPP algorithms the increasing incremental pulse is uniformly increased (e.g., voltage magnitude for a third pulse can be represented as v+2x), while in other algorithms, the increasing incremental pulse is not uniform (e.g., voltage magnitude for a third pulse can be represented as v+x+y). The disclosed subject matter can support substantially any ISPP functionality.

For two-terminal memory that changes state by driving ionized material of an active metal into the interface layer to form the conductive filament or by driving that material back to the active metal source to remove the conductive filament, a number of additional considerations arise. For example, cycling from the on-state to the off-state or vice versa requires power. Reducing the amount of power used to change the state of the memory cell and/or cycle the memory cell can be advantageous. Reducing the number of pulses used to successfully cycle the memory cell (e.g., in connection with ISPP) can also be advantageous, for instance, in terms of power, timing, or speed. Furthermore, the inventor(s) believe that after numerous cycles to the conductive state or on-state, an Ion distribution (e.g., an Ion distribution associated with Ions that form the conductive filament) can adopt some undesirable characteristics such as being too wide relative to an optimal distribution.

The disclosed subject matter relates the various algorithms or procedures used to control electrical characteristics of pulses that change the state of a two-terminal memory cell. For example, by manipulating the electrical characteristics of these pulses, the amount of power used to change the state of (e.g., program or erase) the memory cell can be reduced. Additionally or alternatively, by manipulating the electrical characteristics of these pulses, the number of pulses (e.g., in connection with ISPP) used to change the state of the memory cell can be reduced. Additionally or alternatively, by manipulating the electrical characteristics of these pulses, the Ion distribution for Ions that form the conductive filament can be improved.

The algorithms or procedures that control the electrical characteristics and provide the above-mentioned advantages are further detailed herein, but briefly, generally relate to logically separating a pulse (e.g., a program pulse that sets the cell to a conductive state) into two distinct portions or periods. During a first period of the pulse, various electrical characteristics techniques can be applied to facilitate ionization of the material of the active metal that will ultimately form the conductive filament. This first period is also referred to herein as an "ionization" period or a "kick" period. During a second period of the pulse, various electrical characteristics techniques can be applied to facilitate driving metal ions and/or ionized material of the active metal into the interface layer to form the conductive filament. This second period is also referred to herein as a "driving" period or a "soak" period. By utilizing the disclosed techniques of controlling the electrical characteristics of pulses, the number of pulses used to change the state of the cell can be reduced, the amount of power used per pulse can be reduced, and Ion distribution associated with conductive filament-forming ions can be improved.

In additional embodiments disclosed herein, there is provided a digital storage device comprising two-terminal memory. In some embodiments, such a digital storage device can be removably connected to a computing device (e.g., a host device). In other embodiments, the digital storage device can be integrated with the computing device (e.g., read only memory, random access memory, etc.). In particular, embodiments, the digital storage device can be a memory stick that can be connected to a host computer over a memory interface (e.g., a host interface such as a universal serial bus (USB), or other suitable interface) and can store and retrieve information, and erase stored information, in response to commands by the host device.

Example Enhanced Programming of a Two-Terminal Memory Cell

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, an example memory device 100 is depicted. Memory device 100 can be a removable storage device, which can be connected to or disconnected from a computing device (e.g., a computer, a laptop, a terminal, a smart phone, a table computer, etc.) by way of a communication interface (e.g., a universal serial bus (USB) interface, or another memory bus or interface). In some embodiments, memory device 100 can be deployed on a hardware card for connecting with a server device or other computing device. In still other embodiments, memory device 100 can be a stand-alone device configured to communicate with a remote host device via a suitable remote communication platform (e.g., a wireless interface, a cellular interface, a satellite interface, a wired interface, an Ethernet interface, a broadband over power line interface, memory modules such as DIMMs communicating over buses or interfaces such as DDR3 or DDR4, etc., or the like, or a suitable combination thereof).

Memory device 100 can comprise a controller 102. Controller 102 can be configured to interface to a host device 106 over a host interface 104. Host interface 104 can operate to receive host commands (e.g., high-level commands) from the host computing device related to array of memory 110 on memory device 100. Suitable host commands can include a write command, a read command, an erase command, an overwrite command, or the like, or suitable combinations thereof. Additionally, host interface 104 can be configured to receive data from the host device 106 related to a host command, or provide data stored at array of memory 110 to the host device 106 in response to a host command. Controller 102 can further comprise a memory interface 108 configured to communicate with and execute memory operations (e.g., via low-level commands) in conjunction with array of memory 110 over one or more memory channels/data buses. These data buses can be 8-bit channels, 16-bit channels, or another suitable configuration. In some embodiments, memory controller 102 can perform low-level memory operations with array of memory 110, including write, erase, read, etc. in accord with the high-level host commands.

Figure 2:
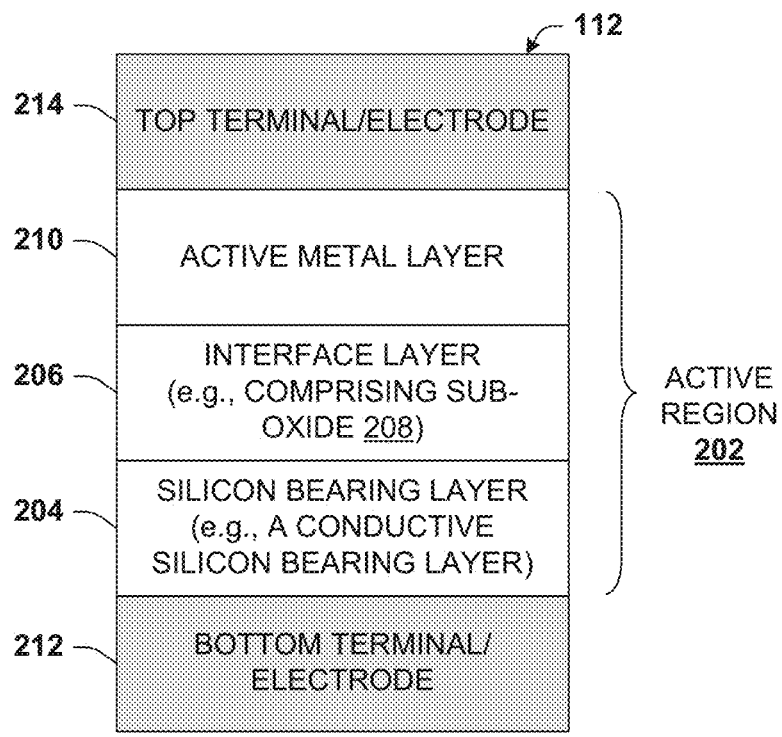
FIG. 2 depicts an example two-terminal memory cell in accordance with certain embodiments of this disclosure.

All or a portion of array of memory 110 can be two-terminal memory. For example, array of memory 110 can comprise two-terminal memory cell (TTMC) 112 that includes an interface layer situated between a top electrode (TE) and a bottom electrode (BE), various example illustrations of which are provided in connection with FIGS. 2-4. In some embodiments, TTMC 112 can be a single-level cell (SLC) characterized by two distinct measurable states. In some embodiments, TTMC 112 can be a multi-level cell (MLC) characterized by different measurable states of the TTMC 112 representing multiple bits of data. In some embodiments, TTMC 112 can be a resistive two-terminal memory cell. In some embodiments, TTMC 112 can be a non-volatile, two-terminal memory cell characterized by maintaining a particular state in the absence or substantial absence of electrical power being supplied to the memory cell.

Memory controller 102 can further comprise a central processing unit (not shown), one or more buffers 116, an optimization component 120, as well as other suitable circuitry, modules, or components. The CPU can be configured to execute instructions associated with memory device 100. Buffers 116 can be a set of registers or other storage elements employed for temporarily storing data. For example, if host device 106 requests data from array of memory 110, the requested data can be stored to buffers 116 and subsequently provided to host device 106. Optionally, data transmitted by host device 106 (e.g., as part of a write instruction) can be temporarily stored to buffers 116 prior to being programmed to array of memory 110. In operation, controller 102 can be configure to program TTMC 112 or erase TTMC 112. Generally, programming TTMC 112 is characterized by application of a program pulse 118 to TTMC 112 that sets TTMC 112 to a conductive state (e.g., an "on-state"). Likewise, erasing TTMC 112 can be characterized by application of an erase pulse (not shown) that sets the TTMC 112 to a resistive state (e.g., an "off-state"). It is understood that controller 102 can program or erase multiple memory cells included in array of memory 110, of which TTMC 112 is utilized herein as a representative example.

Optimization component 120 can be configured to optimize the program pulse based on one or more techniques or algorithms that control the electrical characteristics of the program pulse 118. Such optimization is labeled herein as optimization 122 and various examples of the disclosed optimization of electrical characteristics of program pulse 118 can be found in connection with FIG. 6-8.

To provide more detail, FIGS. 2-8 are now described. FIGS. 2-8 are intended to be referenced in conjunction with FIG. 1 to provide a richer understanding of the disclosed subject matter. Accordingly, while still referring to FIG. 1, but turning also to FIG. 2, an example of TTMC 112 is provided. As noted previously, TTMC 112 can be a resistive-switching memory device such as a resistive random access memory (RRAM) device, for which certain illustrative characteristics or aspects are provided with reference to FIGS. 3 and 4. TTMC 112 may be a monolithic stack of layers and may be formed on top of an insulating substrate upon which one or more complementary metal-oxide-semiconductor (CMOS) devices have been formed. In some embodiments, the CMOS devices include control transistors/control logic, or other devices (e.g. processor, logic) that may be selectively coupled to terminal(s) of a TTMC 112 device.

The monolithic stack of layers of TTMC 112 can include an active region 202 that can be situated between a bottom terminal 212 (e.g., one layer of the monolithic stack) and top terminal 214 (e.g., another layer of the monolithic stack). Active region 202 can be created comprising a contact layer (e.g. a metal layer, a silicon bearing layer, etc.) 204, interface layer 206, and active metal layer 210. Interface layer 206 can be composed of or comprise one or more engineered or controlled oxide(s), which is referred to herein as sub-oxide 208. Interface layer 206 can comprise a non-stoichimetric sub-oxide (e.g., sub-oxide 208) that can be a combination or mixture, possibly non-homogenous, of various silicon-based layers or elements with an aggregate chemical formula of $SiO_x$, where $0<X<2$. As another example, the aggregate chemical formula can be $Si_xGe_yO_z$, where $x \geq 0$, $y \geq 0$, $z \geq 0$, $x+y \leq z \leq 2$ $(x+y)$. In some embodiments, active metal layer 210, as a conductive metal, can double as top terminal 214. In some embodiments, contact layer 204 can double as bottom terminal 212. In various embodiments, interface layer 206 includes multiple crystalline defects. Other examples can exist.

Figure 3:
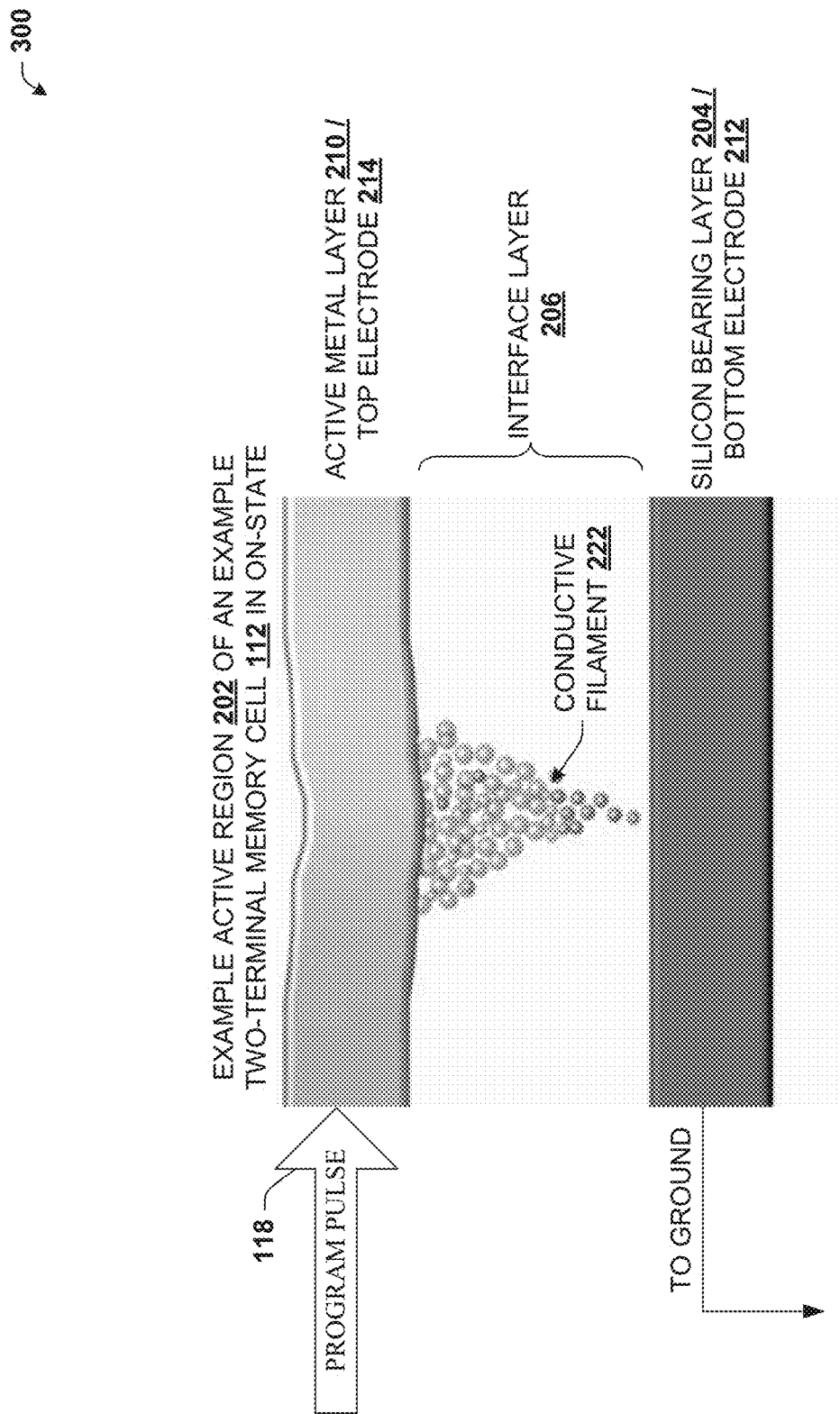
FIG. 3 depicts an example illustration that provides a cross-section of an example active region of an example two-terminal memory cell in a conductive state in accordance with certain embodiments of this disclosure.

FIG. 3 depicts graphical illustration 300. Illustration 300 provides a cross-section of an example active region 202 of an example TTMC 112 in a conductive state (e.g., on-state). In order to provide additional detail or context, it is understood that this disclosure relates to two-terminal memory cells, for example, resistive switching two-terminal memory cells, in various embodiments. Resistive switching two-terminal memory cells (also referred to as resistive switching memory cells or devices), as utilized herein, comprise circuit components having two electrical contacts (also referred to herein as electrodes or terminals) with an active region (e.g., active region 202) between the two conductive contacts (e.g., terminals 212, 214).

Active region 202 can exhibit a plurality of stable or semi-stable resistive states, each resistive state having different electrical characteristics (e.g., resistance, conductance, etc.). Moreover, respective states of the plurality of states can be formed or activated in response to a respective voltage difference applied at the two conductive contacts. Application of this voltage difference is referred to herein as program pulse 118, but in some embodiments can be represented as an erase pulse. One example of a resistive switching two-terminal memory device, though not exhaustive, can include a resistive random access memory (RRAM) cell or device.

Embodiments of the subject disclosure can provide a filamentary-based memory cell. For example, in a 'programmed' or 'on' state, in response to a program voltage applied across the terminals 212, 214, ions are injected or driven from active metal layer 210 to permeate interface layer 206. Once the program voltage is removed, the ions are trapped within the defects of interface layer 206 and become neutral metal particles. In some embodiments, the trapped metal particles form one or more conductive filament(s) 222.

One example of a filamentary-based two-terminal memory cell can comprise: a conductive layer (e.g., 204, comprising, e.g., TiN, TaN, TiW) or a conductive silicon (Si) bearing layer (e.g., polysilicon, polycrystalline, SiGe, etc.); the interface layer 206 (also referred to as a resistive switching layer or a resistive switching material layer), which in this case can comprise sub-oxide 208 or other material having crystalline defects or defect regions (e.g., amorphous silicon, intrinsic silicon, non-stoichimetric silicon oxide); and active metal layer 210 for providing filament-forming particles into the interface layer 206.

In varion examples, the active metal layer 210 can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd), alloys of such metals, as well as materials rich in such metals, such as non-stoichiometric metal compounds. Other suitable conductive materials, as well as compounds or combinations of the foregoing can be employed for the active metal layer 210 in some aspects. In some embodiments, an active metal layer 210 may comprise two or more layers of materials (e.g., sub-layers), such as a layer of silver, aluminum, or the like above a thin layer of oxidizable metal, e.g. titanium. In various embodiments, particles of metal derived from the active metal layer become trapped within the defect regions of the interface layer 206. These trapped particles are neutral metal particles that form conductive filaments within the interface layer 206. Some details pertaining to embodiments of the subject disclosure similar to the foregoing example can be found in the following U.S. patent applications that are licensed to the assignee of the present application for patent: Application Ser. No. 11/875,541 filed Oct. 19, 2007 and application Ser. No. 12/575,921 filed Oct. 8, 2009, each of which are incorporated by reference herein in their respective entireties and for all purposes.

In some aspects, the two-terminal memory can comprise 20 nanometer (nm) technology, whereas in other aspects the two-terminal memory can comprise sub-20 nanometer technology (e.g., 15 nm, 10 nm, 5 nm, and others). Moreover, the two-terminal memory can have a component area that is less than about 5 $F^2$ (e.g., about 4.28 $F^2$). In some aspects, three-dimensional stacks of two-terminal memory arrays can be provided, reducing component area. For instance, a 4.28 $F^2$ device can have an effective component area of 2.14 $F^2$ for a three-dimensional device having two stacked layers. As another example, the 4.28 $F^2$ device can have an effective component area of 1.07 $F^2$ for a three-dimensional device having four stacked layers, and so on. In the case of multi-level cells (MLC), two stacked layers of cells that can represent two bits of data per cell can have an effective component area of 1.07 $F^2$, and better component area metrics can be achieved by either increasing the number of stacks or the number of bits represented by the cells.

Generally, to program one or more memory cells, a suitable program voltage can be applied across the memory cell(s) causing a conductive filament(s) or path(s) to form through a resistive portion (e.g., interface layer) of the memory cell as mentioned above. This can further cause the memory cell to switch from a relatively high resistive state, to a relatively low resistive state. An erase process can be implemented to reverse, remove, or disassociate the conductive filament(s), at least in part, causing the memory cell to return to the high resistive state from the low resistive state. By convention, herein, the relatively high resistive state is referred to as a "resistive state" or an "off-state" and the relatively low resistive state is referred to as a "conductive state" or an "on-state". This physical change of state, in the context of memory, can be associated with respective logical states of a binary bit (or of multiple bits, in the case of the conductive filament(s) being programmable to four or more distinct resistance states). Accordingly, multiple such memory cells can be programmed or erased to represent respective zeroes or ones of binary information and, by retaining those states over time, in effect persist binary information. For various reasons, in some embodiments, resistive switching memory cells are generally quick to program and responsive, changing state readily in response to a program voltage or an erase voltage. This quick switching of state is a significant advantage of various disclosed memory cells over other memory cell technologies.

As applied to illustration 300, when a suitable program pulse 118 (e.g., a positive polarity voltage) is applied across the terminals of two-terminal memory cell 200, ions from active metal layer 210 form and move into the adjacent interface layer 206, which is at least partially permeable to the ions that collectively form one or more conductive filament(s) 222, which although depicted as a single filament can be multiple filaments. Conductive filament 222 can span the entire thickness or a portion of the interface layer 206, facilitating increased electrical conductivity through the interface layer 206, which otherwise has a high electrical resistance. In some cases, when the program voltage is removed, the ions from the active metal layer become trapped within defect regions of interface layer 206 and become neutral metal particles. As noted, when the conductive filament 222 forms, the memory cell is said to be in the on-state, which is a low-resistance and/or high-conductance state.

Figure 4:
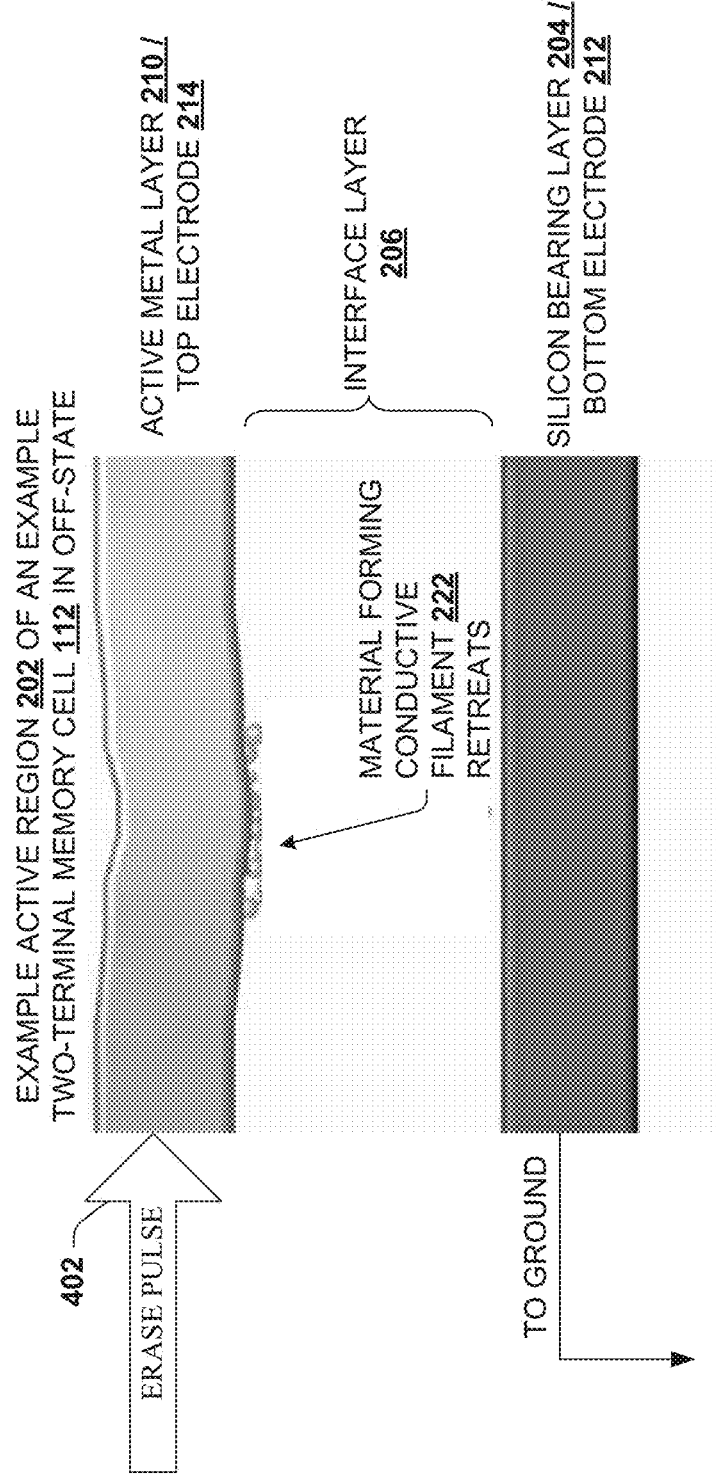
FIG. 4 depicts an example illustration that provides a cross-section of an example active region of an example two-terminal memory cell in a resistive state in accordance with certain embodiments of this disclosure.

With reference now to FIG. 4, graphical illustration 400 is provided. Illustration 400 depicts a cross-section of an example active region 202 of an example TTMC 112 in a resistive state (e.g., off-state). TTMC 112 is typically in a resistive state after fabrication, but once TTMC 112 is programmed to the conductive state (e.g., by program pulse 118 that forms conductive filament(s) 222), TTMC 112 is returned to the resistive state in response to erase pulse 402. For bipolar devices, erase pulse 402 can be of a similar voltage magnitude as erase pulse 118, but of an opposite polarity. In other embodiments (not shown), erase pulse 402 can be the same polarity as program pulse 118, but applied to the opposite terminal of TTMC 112.

In response to erase pulse 402 (e.g., a negative polarity voltage), conductive filament 222 can at least in part deform or retreat back to the active metal layer 210 source, breaking the electrical conductive path. In some embodiments, the particles trapped within interface layer 206 move back toward active metal layer 210, thereby shortening conductive filament 222. Such is a high-resistance state, associated with an off-state. As noted, other suitable de-programming/erase mechanisms consistent with unipolar device operation can exist for causing the off-state for a unipolar two-terminal memory. The state can be determined by measuring current through TTMC 112 when a suitable read voltage is applied. The read voltage generally is not sufficient (or the proper polarity) to either form or disperse conductive filament 222 (e.g., significantly disrupt the neutral metal particles trapped within the defect locations), so current readings associated with the read current can be used to determine if the cell is in the high-resistance state (e.g., off) or the high-conductance state (e.g., on). In the example of FIG. 3, TTMC 112 is in the on-state, with conductive filament 222 spanning a significant portion of interface layer 206. In the example of FIG. 4, TTMC 112 is in the off-state, with little or no conductive filament 222 included in the interface layer 206. In some embodiments, the reverse convention relating to "on" or "off" may also be used.

With the foregoing in mind, referring back to FIG. 1, controller 102 is illustrated to assert program pulse 118 on TTMC 112. This program pulse 118 is intended to set TTMC 112 to a conductive state. Such a conductive state can be accomplished by formation of conductive filament(s) 222 in interface layer 206, as exemplified by illustration 300 of FIG. 3. However, as introduced previously, it is possible that some cells fail to transition to the desired state in response to programming procedures. In order to mitigate issued associated with failed or improper state transitions, incremental step pulse programming (ISPP) can be employed, which is described in more detail with reference to FIG. 5.

Figure 5:
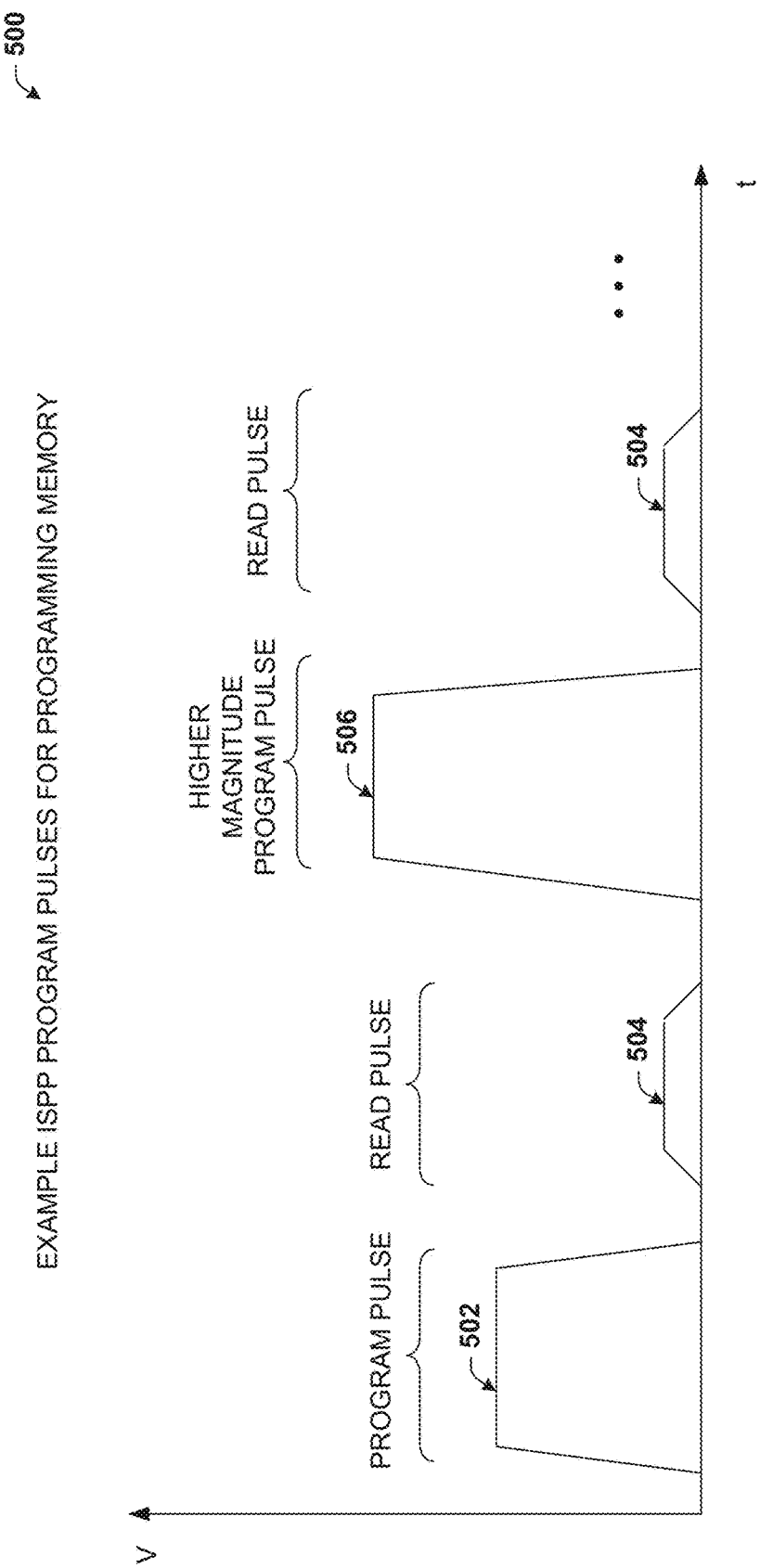
FIG. 5 depicts an example graph that plots voltage over time in connection with ISPP programming pulses intended to program a memory cell in accordance with certain embodiments of this disclosure.

Referring now to FIG. 5, graph 500 is depicted. Graph 500 plots voltage over time in connection with programming pulses intended to program a memory cell. In other two-terminal memory systems, when a memory cell is intended to be programmed, a specific voltage is applied to one of the terminals for defined period. Such is illustrated by program pulse 502. In these other systems, program pulse 502 is typically asserted at a constant voltage over a fixed period. Thereafter, a read pulse 504 is asserted and, by measuring the current through the cell during the read pulse 504, it is verified whether the cell was in fact successfully programmed to the conductive state.

If so, then ISPP operation can end. If the sensing performed by read pulse 504 does not indicate the cell was successfully programmed, then ISPP operation tries again. However, with subsequent program pulses, successively higher magnitude voltages are used, illustrated by program pulse 506. ISPP operates to sequentially step up the magnitude of the voltage until the subsequent read pulse 504 confirms the cell was successfully programmed or until some voltage magnitude or pulse count reaches a defined threshold and the cell is considered bad and/or incapable of changing state. It is noted that every program and read pulse consumes energy. Hence, reduces the number of pulses used to successfully program a cell or reducing the energy consumed by a given pulse whether or not such results in successful program operation can improve operational characteristics of memory device 100 in a variety of ways, including, e.g., improved energy efficiency, improved timing characteristics, improved cycling speed, and so forth.

Still referring to FIG. 1, enhancements directed to energy efficiency, timing, and cycling speed, as well as others, can be accomplished by one or more optimizations 122 provided by optimization component 120 and applied to program pulse 118. Some examples of optimization(s) 122 are provided in and further described with reference to FIGS. 6-8, which provide various plots illustrating an optimization 122 in connection with electrical characteristics of program pulse 118.

Figure 6:
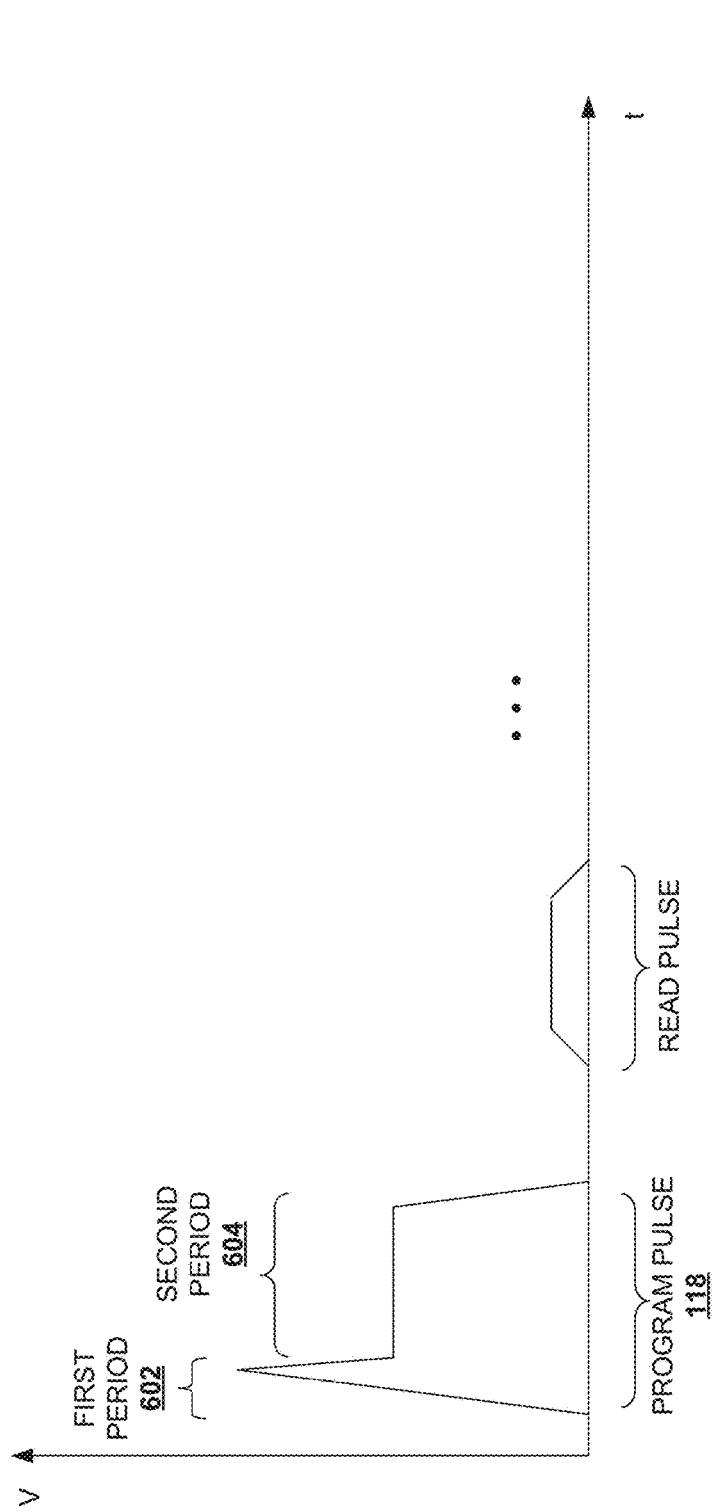
FIG. 6 depicts an example graph that plots voltage over time and illustrates certain electrical characteristics for a first example program pulse that programs a two-terminal memory cell in accordance with certain embodiments of this disclosure.

Turning now to FIG. 6, graph 600 is depicted. Graph 600 illustrates certain electrical characteristics for a first example program pulse 118 that programs a two-terminal memory cell such as TTMC 112. In some embodiments, optimization component 120 can optimize program pulse 118 based on a first algorithm that asserts a higher magnitude voltage during a first period 602 (e.g., a "ionization" or "kick" period) of program pulse 118. In accordance with the first algorithm, optimization component 120 can optimize program pulse 118 by asserting a lower magnitude voltage during a second period 604 (e.g., a "driving" or "soak" period) of program pulse 118.

Generally, the magnitude of the higher magnitude voltage that is asserted during first period 602 can be a magnitude sufficient to ionize material or particles of an active metal (e.g., active metal layer 210) of TTMC 112. The magnitude of the lower magnitude voltage that is asserted during second period 604 can be a magnitude sufficient to drive ions (e.g., ionized particles or material) of the active metal into the interface layer (e.g., interface layer 206). In some embodiments, a difference between the peak higher magnitude voltage (e.g., asserted during first period 602) and the peak or average of the lower magnitude voltage (e.g., asserted during second period 604) can be about one volt. Hence, upon a subsequent read pulse that indicates TTMC 112 was not successfully set to the conductive state in response to program pulse 118, if ISPP is used, then another program pulse 118 can be asserted. This other program pulse 118 can be asserted in which both the higher magnitude voltage (e.g., asserted during first period 602) and the lower magnitude voltage (e.g., asserted during second period 604) can be increased, but the difference between the two voltage magnitudes can remain constant at about one volt or another value.

In some embodiments the value of the peak of the higher magnitude voltage (e.g., asserted during first period 602) can be in a range between about two volts and about three volts or another range suitable for two-terminal memory. In some embodiments, the peak or average value of the lower magnitude voltage (e.g., asserted during second period 604) can be in a range between about one volt and two volts or another range suitable for two-terminal memory. It is appreciated that these example ranges are intended to refer to a first program pulse 118. If ISPP that successively steps up the voltage magnitudes is used, then the stated example range can increase accordingly.

In some embodiments, a duration for the first period 602 can be about 100 nanoseconds. In some embodiments, a duration for the second period 604 can be about 25 microseconds. It is understood that these durations can refer an amount of time that the voltage magnitude is held at one or more particular value(s) and can be inclusive or exclusive of ramp times.

Figure 7:
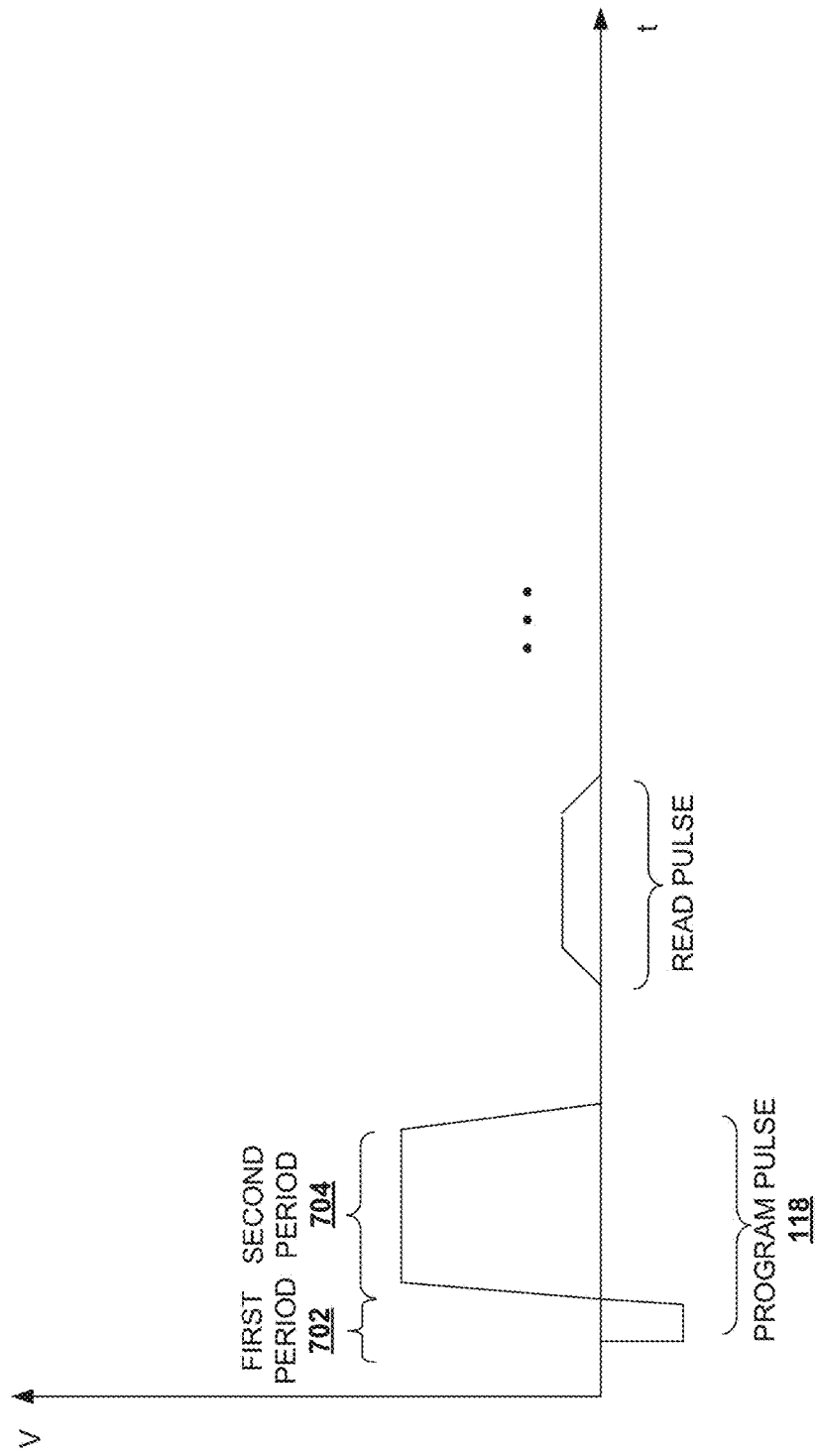
FIG. 7 depicts an example graph that plots voltage over time and illustrates certain electrical characteristics for a second example program pulse that programs a two-terminal memory cell in accordance with certain embodiments of this disclosure.

Turning now to FIG. 7, graph 700 is depicted. Graph 700 illustrates certain electrical characteristics for a second example program pulse 118 that programs a two-terminal memory cell such as TTMC 112. In some embodiments, optimization component 120 can optimize program pulse 118 based on a second algorithm that asserts a first voltage of a first polarity during a first period 702 (e.g., an "ionization" or "kick" period) of program pulse 118. In accordance with the second algorithm, optimization component 120 can optimize program pulse 118 by asserting a second voltage at a second polarity opposite the first polarity during a second period 704 (e.g., a "driving" or "soak" period) of program pulse 118.

As depicted, the polarity of the first voltage can be negative with a rapid transition to the second voltage of reverse polarity. The rapid polarity change can cause a whiplash phenomenon that can improve ionization. Generally, the magnitude of the first voltage that is asserted during first period 702 can be a magnitude sufficient to ionize material or particles of an active metal (e.g., active metal layer 210) of TTMC 112 in combination with the rapid polarity switch. In some embodiments, a magnitude for the first voltage can be about half a volt. The magnitude of the second voltage that is asserted during second period 704 can be a magnitude sufficient to drive ions (e.g., ionized particles or material) of the active metal into the interface layer (e.g., interface layer 206). In some embodiments, a magnitude for the second voltage can be in a range between about one volt and two volts or another range suitable for two-terminal memory. If ISPP that successively steps up the voltage magnitudes is used, then the stated example range can increase accordingly.

In some embodiments, a duration for the first period 702 can be about five microseconds. In some embodiments, a duration for the second period 704 can be about 20 microseconds. It is understood that these durations can refer an amount of time that the voltage magnitude is held at one or more particular value(s) and can be inclusive or exclusive of ramp times.

Figure 8:
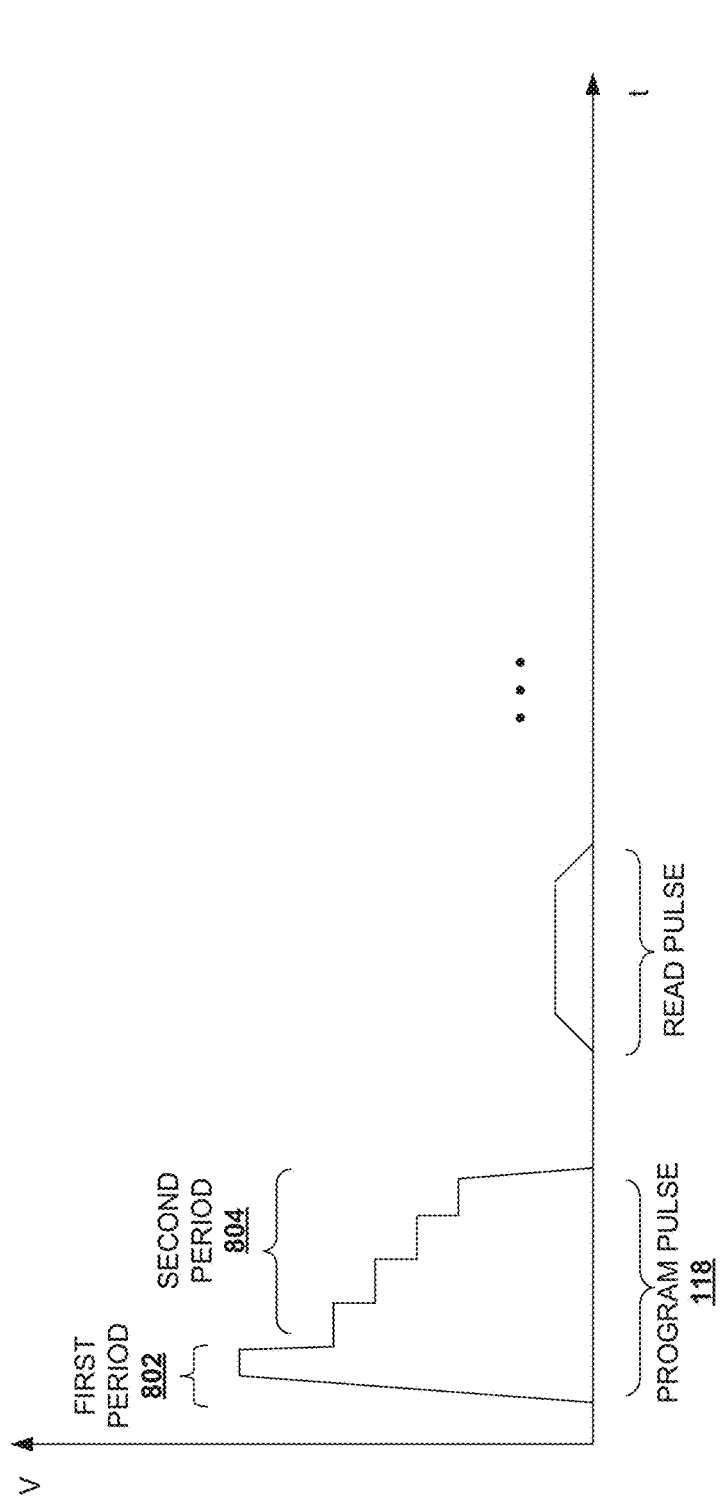
FIG. 8 depicts an example graph that plots voltage over time and illustrates certain electrical characteristics for a third example program pulse that programs a two-terminal memory cell in accordance with certain embodiments of this disclosure.

Turning now to FIG. 8, graph 800 is depicted. Graph 800 illustrates certain electrical characteristics for a third example program pulse 118 that programs a two-terminal memory cell such as TTMC 112. In some embodiments, optimization component 120 can optimize program pulse 118 based on a third algorithm that asserts a first voltage during a first period 802 (e.g., an "ionization" or "kick" period) of program pulse 118. In accordance with the third algorithm, optimization component 120 can optimize program pulse 118 by asserting a set of lower magnitude voltages during a second period 804 (e.g., a "driving" or "soak" period) of program pulse 118.

Generally, the magnitude of the first voltage that is asserted during first period 802 can be a magnitude sufficient to ionize material or particles of an active metal (e.g., active metal layer 210) of TTMC 112. In some embodiments, a magnitude for the first voltage can be in a range between about two volts and about three volts or another range suitable for two-terminal memory. The magnitudes of the set of lower magnitude voltages that are asserted during second period 804 can be sufficient to drive ions (e.g., ionized particles or material) of the active metal into the interface layer (e.g., interface layer 206). As these ionized particles form conductive filament 222, the conductance of TTMC 112 increases, yet by dropping the voltage magnitudes during the second period 804, energy consumption will be lower than otherwise over the soak period. In some embodiments, the series of successively lower magnitude voltage steps successively differ in magnitude by about 0.25 volts. If ISPP that successively steps up the voltage magnitudes is used, then respective magnitudes can increase accordingly, but the magnitude difference between the steps can remain the same.

In some embodiments, a duration for the first period 802 can be about five microseconds. In some embodiments, a duration for the second period 804 can be about 20 microseconds. In some embodiments, a step of successively lower magnitude voltage steps has a duration of about five microseconds. It is understood that these durations can refer an amount of time that the voltage magnitude is held at one or more particular value(s) and can be inclusive or exclusive of ramp times.

Figure 9:
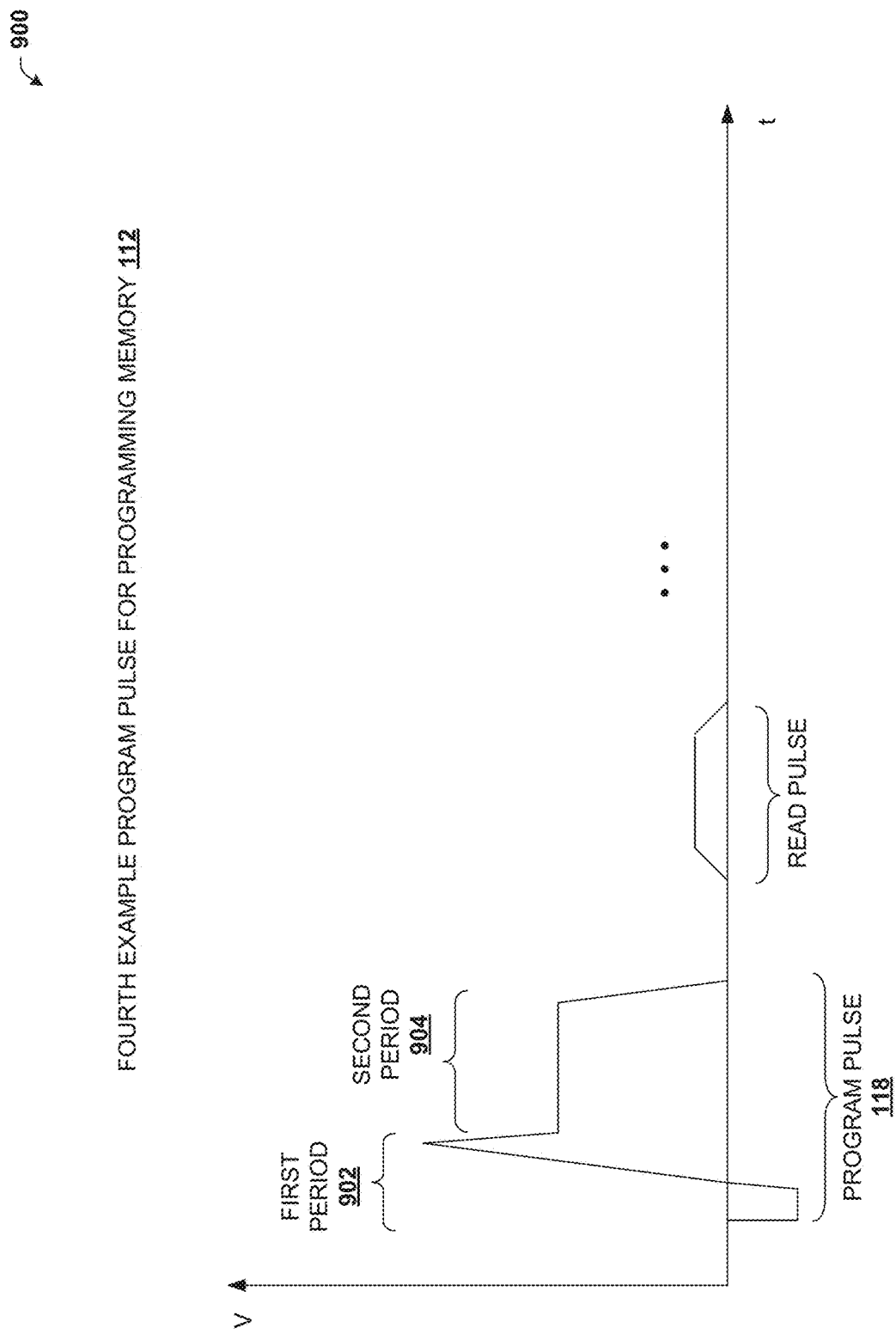
FIG. 9 depicts an example graph that plots voltage over time and illustrates certain electrical characteristics for a fourth example program pulse that programs a two-terminal memory cell in accordance with certain embodiments of this disclosure.

Turning now to FIG. 9, graph 900 is depicted. Graph 900 illustrates certain electrical characteristics for a fourth example program pulse 118 that programs a two-terminal memory cell such as TTMC 112. In some embodiments, optimization component 120 can optimize program pulse 118 based on a fourth algorithm that applies different electrical characteristics during distinct periods (e.g., first period 902 and second period 904) of program pulse 118. For example, during a first part of first period 902, optimization component 120 can assert a first voltage at a first polarity. During a second part of first period 902, optimization component 120 can assert a second voltage at a second polarity that differs from the first polarity. For instance, if the first polarity is negative, the second polarity can be positive, as depicted. During the second period 904, optimization component 120 can assert a third voltage that has a lower magnitude than the second voltage. In some embodiments, the fourth algorithm can substantially be a combination of the first algorithm and the second algorithm. It is understood that various other combinations can be made.

Generally, the magnitude of the second voltage that is asserted during first period 902 can be a magnitude sufficient to ionize material or particles of an active metal (e.g., active metal layer 210) of TTMC 112 or sufficient in combination with the first voltage with opposite polarity. In some embodiments, a magnitude for the first voltage can be in a range up to about one volt or another range suitable for two-terminal memory. A magnitude for the second voltage can be in a range between about one volt and about three volts or another range suitable for two-terminal memory. In some embodiments, a magnitude for the second voltage can be about one volt greater than a magnitude for the third voltage. In some embodiments, the magnitude of the third voltage can sufficient to drive ions of an active metal of the TTMC 112 into the interface layer 206.

In some embodiments, a duration for the first period 902 can be about five microseconds. In some embodiments, a duration for the second period 904 can be about 20 microseconds. In some embodiments, the first part of first period 902 in which the first voltage is asserted can have a duration of about five microseconds, while the second part of first period 902 in which the second voltage is asserted can have a duration of a bout 100 nanoseconds. It is understood that these durations can refer an amount of time that the voltage magnitude is held at one or more particular value(s) and can be inclusive or exclusive of ramp times.

Example Methods for Enhanced Programming of a Two-Terminal Memory Cell

The diagrams included herein are described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 10:
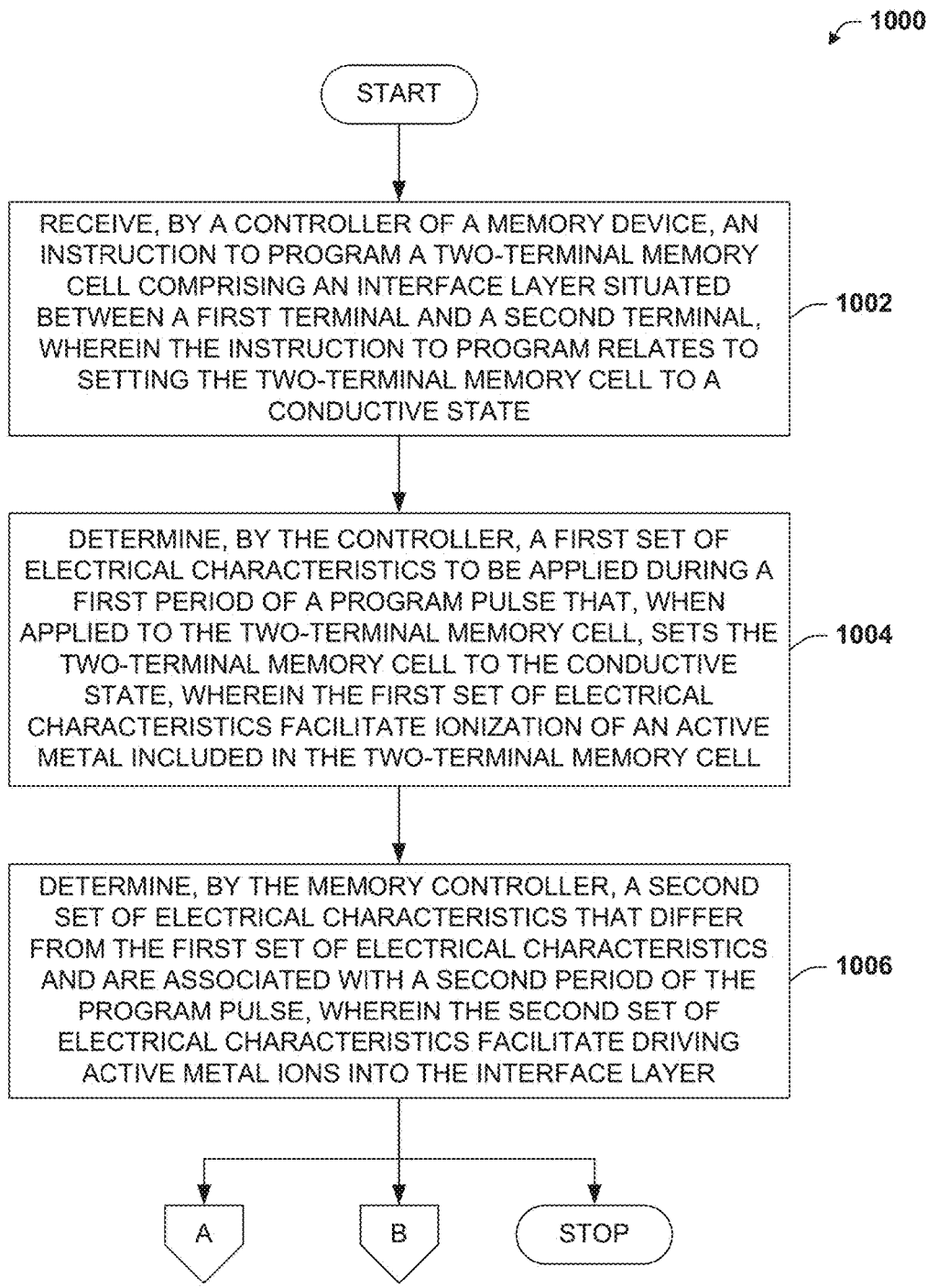
FIG. 10 illustrates an example methodology that can provide for adjusting electrical characteristics of a program pulse that sets a memory cell to a conductive state in accordance with certain embodiments of this disclosure.
Figure 11:
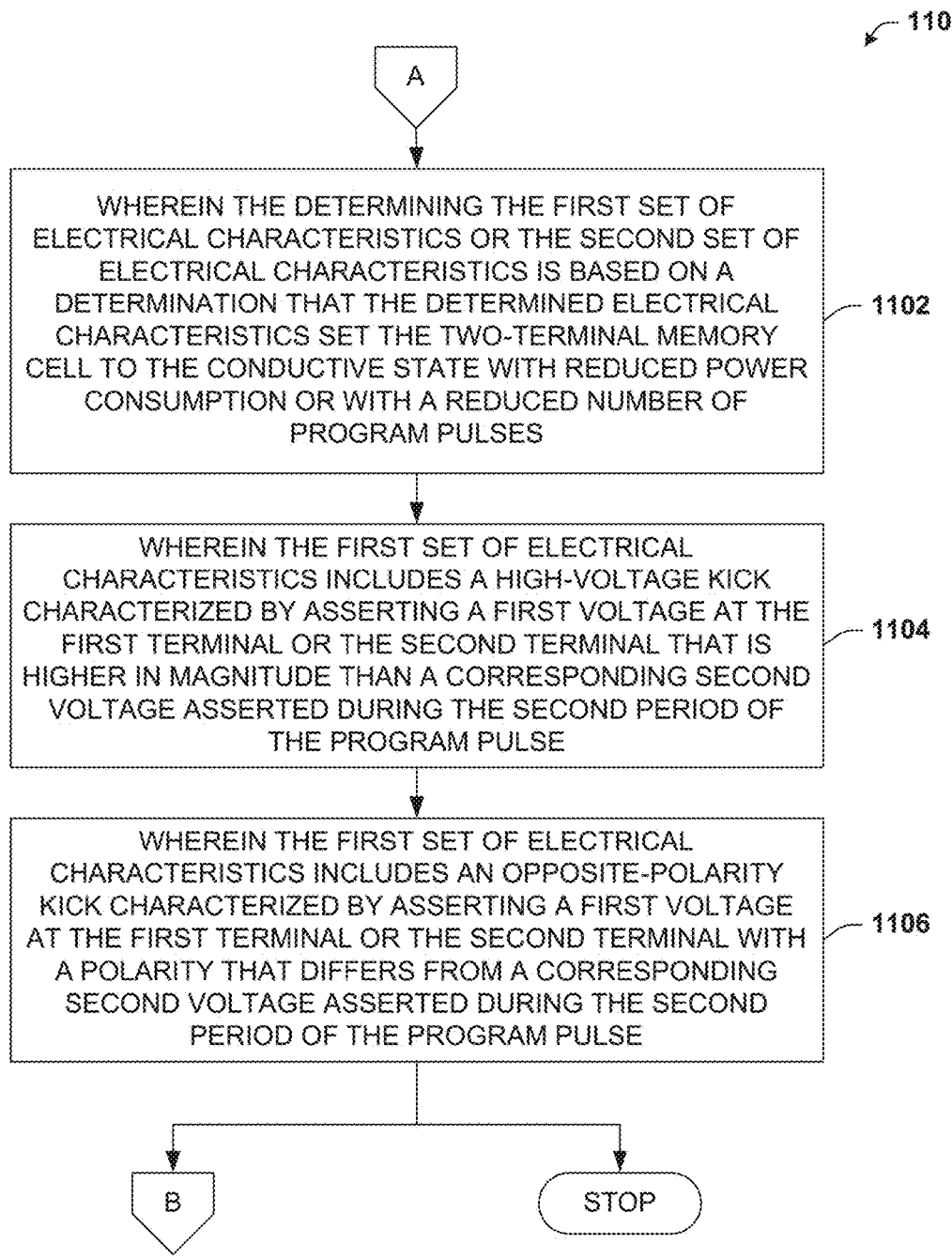
FIG. 11 illustrates an example methodology that can provide additional aspects or elements associated with the first set of electrical characteristics in accordance with certain embodiments of this disclosure.
Figure 12:
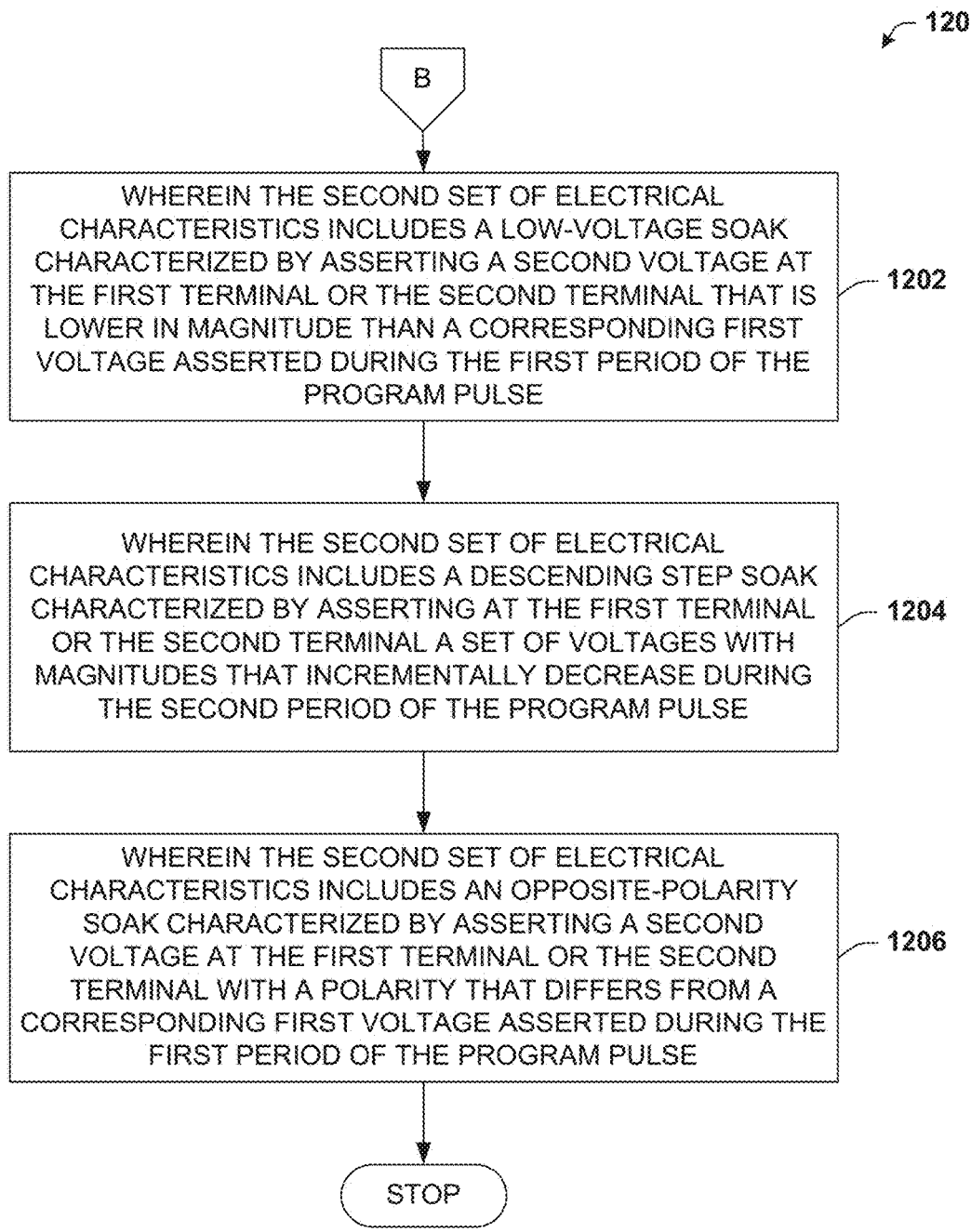
FIG. 12 illustrates an example methodology that can provide additional aspects or elements associated with the second set of electrical characteristics in accordance with certain embodiments of this disclosure.

In view of the exemplary diagrams described supra, process methods that can be implemented in accordance with the disclosed subject matter will be better appreciated with reference to the flow charts of FIGS. 10-12. While for purposes of simplicity of explanation, the methods of FIGS. 10-12 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Referring now to FIG. 10, exemplary method 1000 is illustrated. Method 1000 can provide for adjusting electrical characteristics of a program pulse that sets a memory cell to a conductive state. For example, the electrical characteristics of the program pulse can be adjusted to improve cell programming such as to reduce an amount of power used to change the state of the cell, to reduce a number of pulses used to change the state of the cell, to improve Ion distribution of a cell, or the like.

At reference numeral 1002, a controller of a memory device can receive an instruction to program a two-terminal memory cell, which can comprise a resistive interface layer situated between a first terminal and a second terminal. The instruction to program the two-terminal memory cell can relate to setting the two-terminal memory cell to a conductive state. In some embodiments, the instruction can be a high-level instruction received from a host device.

In response to this instruction, the controller can translate the high-level instruction to a low-level instruction to operate on the physical memory. After translation, the program pulse aimed at setting the state of the memory cell can be enhanced. For example, at reference numeral 1004 the controller can determine a first set of electrical characteristics to be applied during a first period of a program pulse that, when applied to the two-terminal memory cell, sets the two-terminal memory cell to the conductive state. The first set of electrical characteristics can be suitable for facilitating ionization of an active metal included in the two-terminal memory cell.

At reference numeral 1006, the controller can determine a second set of electrical characteristics that differ from the first set of electrical characteristics and are associated with or applied during a second period of a program pulse. The second set of electrical characteristics can be suitable for driving active metal ions (e.g., ionized particles or material) into the interface layer.

Turning now to FIG. 11, exemplary method 1100 is illustrated. Method 1100 can provide additional aspects or elements associated with the first set of electrical characteristics. For example, at reference numeral 1102, the determining the first set of electrical characteristics (e.g., determined at reference numeral 1004 of FIG. 10) or the second set of electrical characteristics (e.g., determined at reference numeral 1006 of FIG. 10) can be determined based on another determination that electrical characteristics at issue set the two-terminal memory cell to the conductive state with reduced power consumption or with a reduced number of pulses.

At reference numeral 1104, the first set of electrical characteristics can be determined to include a high-voltage kick characterized by asserting a first voltage at the first terminal or the second terminal that is higher in magnitude than a corresponding second voltage asserted during the second period of the program pulse. As noted, this high-voltage kick can facilitate ionization of active metal particles or material included in an active metal layer of the memory cell that is in contact with the interface layer of the memory cell.

At reference numeral 1106, the first set of electrical characteristics can be determined to include an opposite polarity kick characterized by asserting a first voltage at the first terminal or the second terminal with a polarity that differs from a corresponding second voltage asserted during the second period of the program pulse. As noted, this opposite polarity kick can facilitate ionization of active metal particles or material included in an active metal layer of the memory cell that is in contact with the interface layer of the memory cell.

Referring now to FIG. 12, exemplary method 1200 is illustrated. Method 1200 can provide additional aspects or elements associated with the second set of electrical characteristics. For example, at reference numeral 1202, the second set of electrical characteristics (e.g., determined at reference numeral 1006 of FIG. 10) can be determined to include a low-voltage soak. This low-voltage soak can be characterized by asserting a second voltage at the first terminal or the second terminal that is lower in magnitude than a corresponding first voltage asserted during the first period of the program pulse. As noted, this low-voltage soak can facilitate driving ionized particles of the active metal into the interface layer of the memory cell.

At reference numeral 1204, the second set of electrical characteristics (e.g., determined at reference numeral 1006 of FIG. 10) can be determined to include a descending-step soak. This descending-step soak can be characterized by asserting at the first terminal or the second terminal a set of voltages with respective magnitudes that incrementally decrease during the second period of the program pulse. As noted, this descending-step soak can facilitate driving ionized particles of the active metal into the interface layer of the memory cell.

At reference numeral 1206, the second set of electrical characteristics (e.g., determined at reference numeral 1006 of FIG. 10) can be determined to include an opposite-polarity soak. This opposite-polarity soak can be characterized by asserting a second voltage at the first terminal or the second terminal with a polarity that differs from a corresponding first voltage asserted during the first period of the program pulse. As noted, this opposite-polarity soak can facilitate driving ionized particles of the active metal into the interface layer of the memory cell.

Example Operating Environments

Figure 13:
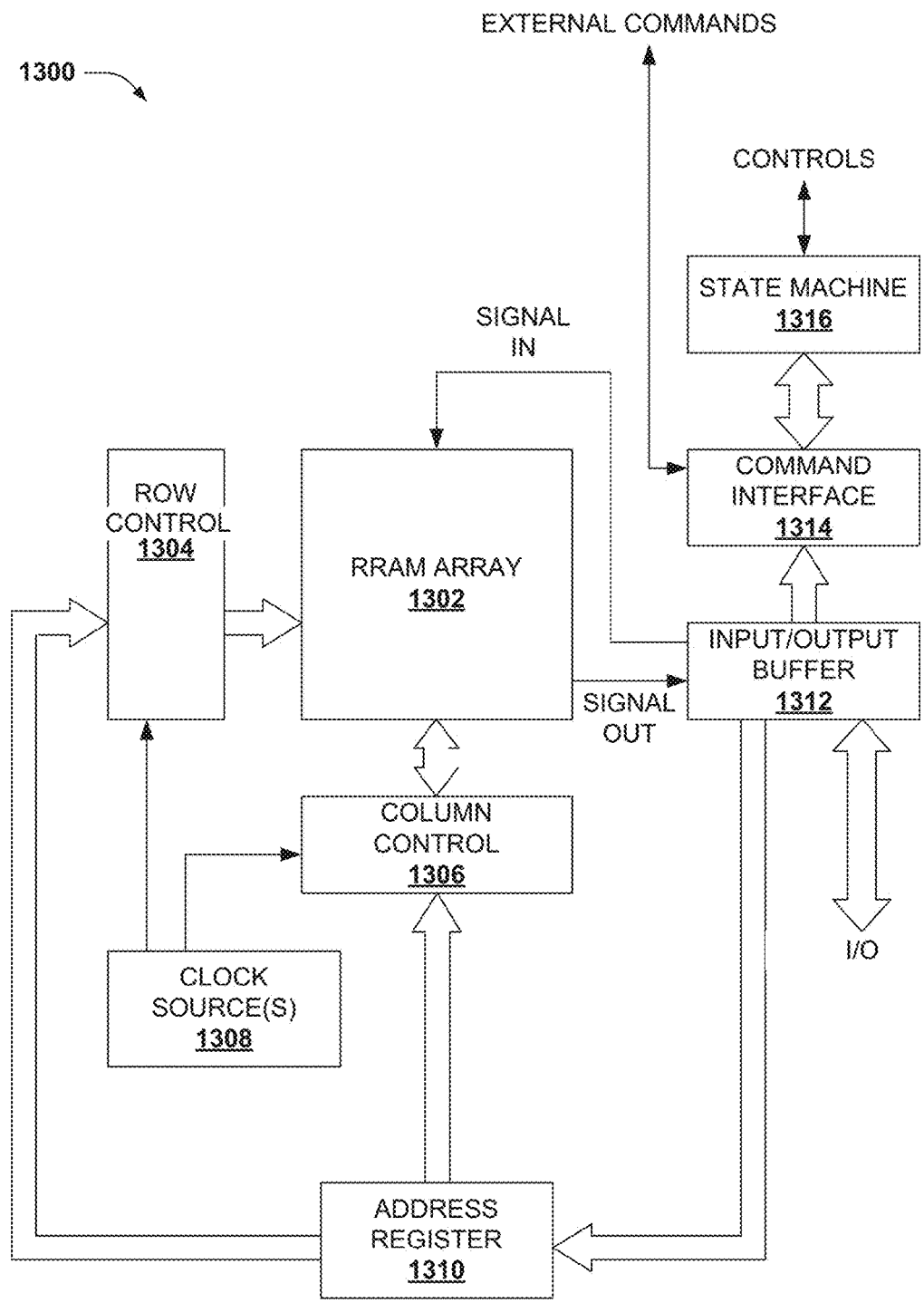
FIG. 13 illustrates a block diagram of an example electronic operating environment in accordance with certain embodiments of this disclosure.

In order to provide a context for the various aspects of the disclosed subject matter, FIG. 13, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 13 illustrates a block diagram of an example operating and control environment 1300 for a RRAM array 1302 according to aspects of the subject disclosure. In at least one aspect of the subject disclosure, RRAM array 1302 can comprise a variety of RRAM memory cell technology. Particularly, RRAM array can be configured or operated to mitigate or avoid sneak path currents of the RRAM array, as described herein.

A column controller 1306 can be formed adjacent to RRAM array 1302. Moreover, column controller 1306 can be electrically coupled with bit lines of RRAM array 1302. Column controller 1306 can control respective bitlines, applying suitable program, erase or read voltages to selected bitlines.

In addition, operating and control environment 1300 can comprise a row controller 1304. Row controller 1304 can be formed adjacent to column controller 1306, and electrically connected with word lines of RRAM array 1302. Row controller 1304 can select particular rows of memory cells with a suitable selection voltage. Moreover, row controller 1304 can facilitate program, erase or read operations by applying suitable voltages at selected word lines.

A clock source(s) 1308 can provide respective clock pulses to facilitate timing for read, write, and program operations of row control 1304 and column control 1306. Clock source(s) 1308 can further facilitate selection of word lines or bit lines in response to external or internal commands received by operating and control environment 1300. An input/output buffer 1312 can be connected to an external host apparatus, such as a computer or other processing device (not depicted) by way of an I/O buffer or other I/O communication interface. Input/output buffer 1312 can be configured to receive write data, receive an erase instruction, output readout data, and receive address data and command data, as well as address data for respective instructions. Address data can be transferred to row controller 1304 and column controller 1306 by an address register 1310. In addition, input data is transmitted to RRAM array 1302 via signal input lines, and output data is received from RRAM array 1302 via signal output lines. Input data can be received from the host apparatus, and output data can be delivered to the host apparatus via the I/O buffer.

Commands received from the host apparatus can be provided to a command interface 1314. Command interface 1314 can be configured to receive external control signals from the host apparatus, and determine whether data input to the input/output buffer 1312 is write data, a command, or an address. Input commands can be transferred to a state machine 1316.

State machine 1316 can be configured to manage programming and reprogramming of RRAM array 1302. State machine 1316 receives commands from the host apparatus via input/output interface 1312 and command interface 1314, and manages read, write, erase, data input, data output, and like functionality associated with RRAM array 1302. In some aspects, state machine 1316 can send and receive acknowledgments and negative acknowledgments regarding successful receipt or execution of various commands.

To implement read, write, erase, input, output, etc., functionality, state machine 1316 can control clock source(s) 1308. Control of clock source(s) 1308 can cause output pulses configured to facilitate row controller 1304 and column controller 1306 implementing the particular functionality. Output pulses can be transferred to selected bit lines by column controller 1306, for instance, or word lines by row controller 1304, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

The systems and processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 14:
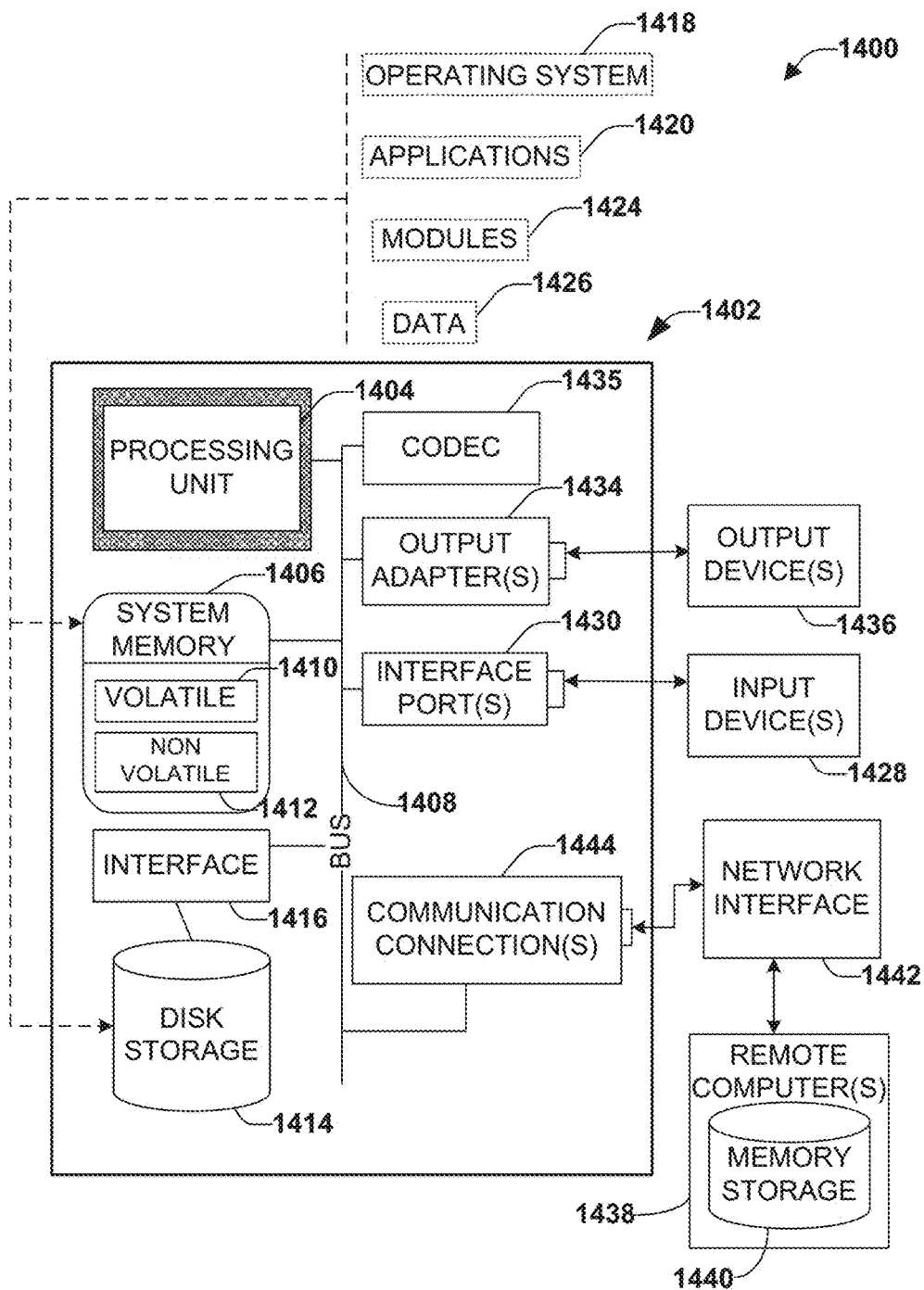
FIG. 14 illustrates a block diagram of an example computing environment in accordance with certain embodiments of this disclosure.

With reference to FIG. 14, a suitable environment 1400 for implementing various aspects of the claimed subject matter includes a computer 1402. The computer 1402 includes a processing unit 1404, a system memory 1406, a codec 1435, and a system bus 1408. The system bus 1408 couples system components including, but not limited to, the system memory 1406 to the processing unit 1404. The processing unit 1404 can be any of various available processors. Dual microprocessors and other multiprocessor architectures also can be employed as the processing unit 1404.

The system bus 1408 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1406 includes volatile memory 1410 and non-volatile memory 1412. The basic input/output system (BIOS), containing the basic routines to transfer information between elements within the computer 1402, such as during start-up, is stored in non-volatile memory 1412. In addition, according to present innovations, codec 1435 may include at least one of an encoder or decoder, wherein the at least one of an encoder or decoder may consist of hardware, software, or a combination of hardware and software. Although, codec 1435 is depicted as a separate component, codec 1435 may be contained within non-volatile memory 1412. By way of illustration, and not limitation, non-volatile memory 1412 can include read only memory (ROM), programmable ROM (PROM), electrically programmable ROM (EPROM), electrically erasable programmable ROM (EEPROM), or flash memory. Volatile memory 1410 includes random access memory (RAM), which acts as external cache memory. According to present aspects, the volatile memory may store the write operation retry logic (not shown in FIG. 14) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1402 may also include removable/non-removable, volatile/non-volatile computer storage medium. FIG. 14 illustrates, for example, disk storage 1414. Disk storage 1414 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1414 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1414 to the system bus 1408, a removable or non-removable interface is typically used, such as interface 1416. It is appreciated that storage devices 1414 can store information related to a user. Such information might be stored at or provided to a server or to an application running on a user device. In one embodiment, the user can be notified (e.g., by way of output device(s) 1436) of the types of information that are stored to disk storage 1414 and/or transmitted to the server or application. The user can be provided the opportunity to opt-in or opt-out of having such information collected and/or shared with the server or application (e.g., by way of input from input device(s) 1428).

It is to be appreciated that FIG. 14 describes software that acts as an intermediary between users and the basic computer resources described in the suitable operating environment 1400. Such software includes an operating system 1418. Operating system 1418, which can be stored on disk storage 1414, acts to control and allocate resources of the computer system 1402. Applications 1420 take advantage of the management of resources by operating system 1418 through program modules 1424, and program data 1426, such as the boot/shutdown transaction table and the like, stored either in system memory 1406 or on disk storage 1414. It is to be appreciated that the claimed subject matter can be implemented with various operating systems or combinations of operating systems.

A user enters commands or information into the computer 1402 through input device(s) 1428. Input devices 1428 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1404 through the system bus 1408 via interface port(s) 1430. Interface port(s) 1430 include, for example, a serial port, a parallel port, a game port, and a universal serial bus (USB). Output device(s) 1436 use some of the same type of ports as input device(s) 1428. Thus, for example, a USB port may be used to provide input to computer 1402 and to output information from computer 1402 to an output device 1436. Output adapter 1434 is provided to illustrate that there are some output devices 1436 like monitors, speakers, and printers, among other output devices 1436, which require special adapters. The output adapters 1434 include, by way of illustration and not limitation, video and sound cards that provide a means of connection between the output device 1436 and the system bus 1408. It should be noted that other devices and/or systems of devices provide both input and output capabilities such as remote computer(s) 1438.

Computer 1402 can operate in a networked environment using logical connections to one or more remote computers, such as remote computer(s) 1438. The remote computer(s) 1438 can be a personal computer, a server, a router, a network PC, a workstation, a microprocessor based appliance, a peer device, a smart phone, a tablet, or other network node, and typically includes many of the elements described relative to computer 1402. For purposes of brevity, only a memory storage device 1440 is illustrated with remote computer(s) 1438. Remote computer(s) 1438 is logically connected to computer 1402 through a network interface 1442 and then connected via communication connection(s) 1444. Network interface 1442 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1444 refers to the hardware/software employed to connect the network interface 1442 to the bus 1408. While communication connection 1444 is shown for illustrative clarity inside computer 1402, it can also be external to computer 1402. The hardware/software necessary for connection to the network interface 1442 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method, comprising:
   receiving, by a controller of a memory device, an instruction to program a two-terminal memory cell comprising an interface layer situated between a first terminal and a second terminal, wherein the instruction to program relates to setting the two-terminal memory cell to a conductive state;
   determining, by the controller, a first set of electrical characteristics to be applied during a first period of a program pulse that, when applied to the two-terminal memory cell, sets the two-terminal memory cell to the conductive state, wherein the first set of electrical characteristics facilitate ionization of an active metal included in the two-terminal memory cell; and
   determining, by the controller, a second set of electrical characteristics that differ from the first set of electrical characteristics and are associated with a second period of the program pulse, wherein the second set of electrical characteristics facilitate driving active metal ions into the interface layer.

2. The method of claim 1, wherein the determining the first set of electrical characteristics or the second set of electrical characteristics is based on a determination that determined electrical characteristics set the two-terminal memory cell to the conductive state with reduced power consumption or with a reduced number of program pulses.

3. The method of claim 1, wherein the first set of electrical characteristics includes a high-voltage kick characterized by asserting a first voltage at the first terminal or the second terminal that is higher in magnitude than a corresponding second voltage asserted during the second period of the program pulse.

4. The method of claim 1, wherein the first set of electrical characteristics includes an opposite-polarity kick characterized by asserting a first voltage at the first terminal or the second terminal with a polarity that differs from a corresponding second voltage asserted during the second period of the program pulse.

5. The method of claim 1, wherein the second set of electrical characteristics includes a low-voltage soak characterized by asserting a second voltage at the first terminal or the second terminal that is lower in magnitude than a corresponding first voltage asserted during the first period of the program pulse.

6. The method of claim 1, wherein the second set of electrical characteristics includes a descending step soak characterized by asserting at the first terminal or the second terminal a set of voltages with magnitudes that incrementally decrease during the second period of the program pulse.

7. The method of claim 1, wherein the second set of electrical characteristics includes an opposite-polarity soak characterized by asserting a second voltage at the first terminal or the second terminal with a polarity that differs from a corresponding first voltage asserted during the first period of the program pulse.

8. A memory device, comprising:
an array of memory cells comprising a two-terminal memory cell that includes an interface layer situated between a top electrode and a bottom electrode;
a controller device that programs the two-terminal memory cell characterized by application of a program pulse that sets the two-terminal memory cell to a conductive state; and
an optimization component that:
determines first electrical characteristics to be applied to the two-terminal memory cell during a first period of the program pulse, wherein the first electrical characteristics are determined to ionize an active metal of the two-terminal memory cell; and
determines second electrical characteristics that differ from the first electrical characteristics to be applied to the two-terminal memory cell during a second period of the program pulse, wherein the second electrical characteristics are determined to drive ions of the active metal into the interface layer.

9. The memory device of claim 8, wherein the first electrical characteristics comprise a higher magnitude voltage asserted during the first period and the second electrical characteristics comprise a lower magnitude voltage asserted during the second period.

10. The memory device of claim 9, wherein the higher magnitude voltage is about one volt in magnitude greater than the lower magnitude voltage.

11. The memory device of claim 9, wherein a duration of the first period is about 100 nanoseconds.

12. The memory device of claim 9, wherein a duration of the second period is about 25 microseconds.

13. The memory device of claim 8, wherein the first electrical characteristics comprise a first voltage of a first polarity asserted during the first period and the second electrical characteristics comprise a second voltage of a second polarity opposite the first polarity asserted during the second period.

14. The memory device of claim 13, wherein the first voltage has a magnitude of about 0.5 volts.

15. The memory device of claim 13, wherein the second voltage has a magnitude in a range of about one volt to about two volts.

16. The memory device of claim 13 wherein the first polarity is negative and the second polarity is positive.

17. The memory device of claim 13 wherein a duration of the first period is about five microseconds.

18. The memory device of claim 13 wherein a duration of the second period is about 20 microseconds.

19. The memory device of claim 8, wherein the first electrical characteristics comprise a higher magnitude voltage asserted during the first period and the second electrical characteristics comprise a set of lower magnitude voltage steps asserted during the second period.

20. The memory device of claim 19, wherein the higher magnitude voltage has a magnitude in a range between about two volts and about three volts.

21. The memory device of claim 19, wherein a duration of the first period is about five microseconds.

22. The memory device of claim 19 wherein the set of lower magnitude voltage steps comprises a series of successively lower magnitude voltage steps.

23. The memory device of claim 22 wherein the series of successively lower magnitude voltage steps successively differ in magnitude by about 0.25 volts.

24. The memory device of claim 22 wherein a duration of a step of the series of successively lower magnitude voltage steps is about five microseconds.

25. The memory device of claim 19, wherein a duration of the second period is about 20 microseconds.

26. The memory device of claim 8, wherein the first electrical characteristics comprise a first voltage with a first polarity and a second voltage with a second polarity that differs from the first polarity and the second electrical characteristics comprise a third voltage that has a lower magnitude than the second voltage.

27. The memory device of claim 26, wherein the second voltage and the third voltage have a positive polarity and the first voltage has a negative polarity.

28. The memory device of claim 26, wherein the second voltage is about one volt in magnitude greater than the third voltage.

29. The memory device of claim 26 wherein a duration of the first voltage is about five microseconds.

30. The memory device of claim 26 wherein a duration of the second voltage is about 100 nanoseconds.

31. The memory device of claim 26 wherein a duration of the third voltage is about 20 microseconds.

* * * * *